(12) United States Patent
Curtis et al.

(10) Patent No.: US 8,448,123 B2
(45) Date of Patent: May 21, 2013

(54) IMPLEMENTING NET ROUTING WITH ENHANCED CORRELATION OF PRE-BUFFERED AND POST-BUFFERED ROUTES

(75) Inventors: Paul G. Curtis, Fort Collins, CO (US); Timothy D. Helvey, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 12/910,214

(22) Filed: Oct. 22, 2010

(65) Prior Publication Data

US 2012/0102446 A1  Apr. 26, 2012

(51) Int. Cl.
G06F 17/50 (2006.01)

(52) U.S. Cl.
USPC ............................. 716/129; 716/114; 716/115

(58) Field of Classification Search
USPC .......................... 716/114, 115, 119, 134, 129
See application file for complete search history.

(56) References Cited

U.S. PATENT DOCUMENTS

| | | | | |
|---|---|---|---|---|
| 6,145,116 A * | 11/2000 | Tawada | ......................... | 716/114 |
| 6,560,752 B1 * | 5/2003 | Alpert et al. | .................. | 716/114 |
| 7,251,800 B2 * | 7/2007 | McElvain et al. | ............. | 716/112 |
| 7,392,493 B2 * | 6/2008 | Alpert et al. | .................. | 716/114 |
| 7,962,876 B2 * | 6/2011 | Oh et al. | ....................... | 716/113 |
| 2005/0283750 A1 * | 12/2005 | Kosugi et al. | ................... | 716/11 |

* cited by examiner

*Primary Examiner* — Vuthe Siek
*Assistant Examiner* — Mohammed Alam
(74) *Attorney, Agent, or Firm* — Joan Pennington

(57) ABSTRACT

A method, system and computer program product are provided for implementing enhanced net routing with improved correlation of pre-buffered and post-buffered routes on a hierarchical design of an integrated circuit chip. In initial wiring steps the nets are routed, and then buffers are add along the net route based upon predetermined electrical parameters. Responsive to adding the buffers, distance based constraints are added to the nets. Then the nets that have been modified are rerouted.

17 Claims, 6 Drawing Sheets

PRIOR ART

400

IMPLEMENTING NET ROUTING WITH ENHANCED CORRELATION OF PRE-BUFFERED AND POST-BUFFERED ROUTES

FIELD OF THE INVENTION

The present invention relates generally to the data processing field, and more particularly, relates to a method, system and computer program product for implementing enhanced net routing with improved correlation of pre-buffered and post-buffered routes on a hierarchical design of an integrated circuit chip.

DESCRIPTION OF THE RELATED ART

Referring to FIG. 3, a prior art design methodology for an application specific integrated circuit (ASIC) is illustrated. The design of modern integrated circuits is a complex task.

In ASIC design, a common design methodology for adding buffering to long nets includes as shown in Step 1 of FIG. 3, first routing the nets or wires between random logic macros (RLMs) on the integrated circuit chip. In the illustrated initial wiring Step 1, a first net A includes a wiring plane constraint of an upper layer 2, and a pair of nets B and C without wiring plane constraints.

Then in a buffering Step 2, buffers indicated by triangles are added along the route of each of the nets A, B, and C. Next in a reroute Step 3, the nets are rerouted that have been modified.

For the initial routing without buffers, timing-critical nets may be constrained to thicker or faster wiring planes in order to meet timing requirements. The rest of the nets would not be constrained.

For the nets that have not been constrained there are cases where the router may choose to route these nets on an upper wire plane anyway, for example, in order to jump over a blockage. After buffers are inserted along the routes, some buffers could therefore be driving nets, which are physically long, but are not assigned to an upper wiring plane.

This prior art design methodology can lead to correlation issues when timing the design because the timing/extraction tool will assume the net is on lower wire planes. Also when re-routing the design the router may choose a different path if the net is not specifically assigned to an upper layer. For example, as illustrated in Step 3 of FIG. 3, where net C was buffered assuming a route on a thicker plane but has thin routes in the rerouting step. As a result, the buffers may be placed too far apart to meet design requirements.

A need exists for an efficient and effective mechanism to implement enhanced net routing with improved correlation of pre-buffered and post-buffered routes on a hierarchical design of an integrated circuit chip.

SUMMARY OF THE INVENTION

A principal aspect of the present invention is to provide a method, system and computer program product for implementing enhanced net routing with improved correlation of pre-buffered and post-buffered routes on a hierarchical design of an integrated circuit chip. Other important aspects of the present invention are to provide such method, system, and computer program product substantially without negative effects and that overcome many of the disadvantages of prior art arrangements.

In brief, a method, system and computer program product are provided for implementing enhanced net routing with improved correlation of pre-buffered and post-buffered routes on a hierarchical design of an integrated circuit chip. In initial wiring steps the nets are routed, and then add buffers along the net route based upon predetermined electrical parameters. Responsive to the adding the buffers, distance based constraints are added to the nets. Then the nets that have been modified are rerouted.

In accordance with features of the invention, adding distance based constraints to the nets, responsive to adding the buffers includes identifying nets without wiring constraints.

In accordance with features of the invention, adding distance based constraints to the nets includes comparing a net length between buffers with a predefined user-selected threshold, and adding a wiring plane constraint to predefined wiring plane responsive to the net length being longer than said predefined user-selected threshold.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, a system, and a computer program product are provided for implementing enhanced net routing on a hierarchical design of an integrated circuit chip. The invention provides improved correlation of pre-buffered and post-buffered routes.

Figure 1:
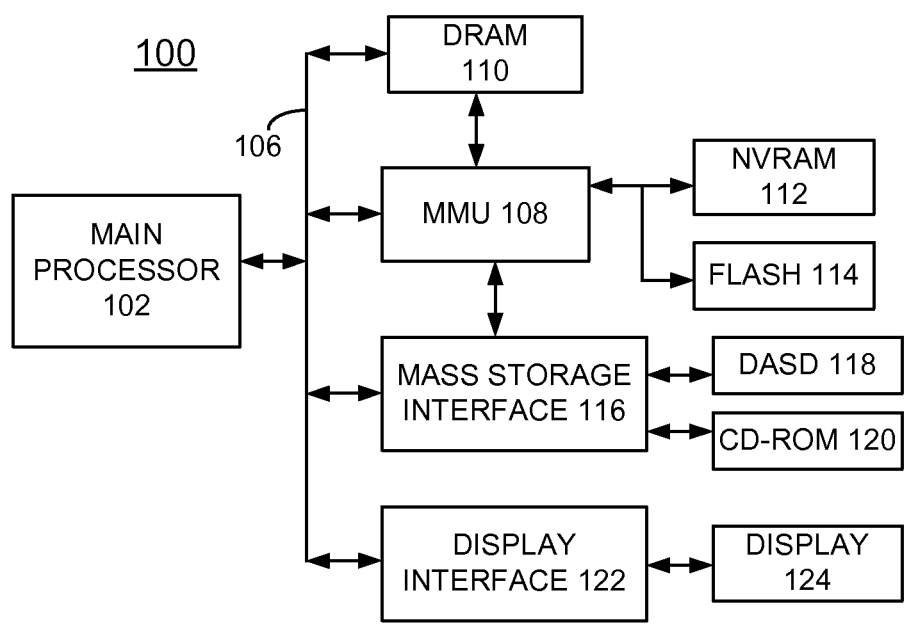
FIGS. 1 and 2 are block diagram representations illustrating an example computer system and operating system for implementing enhanced net routing with improved correlation of pre-buffered and post-buffered routes on a hierarchical design of an integrated circuit chip in accordance with the preferred embodiment.
Figure 2:
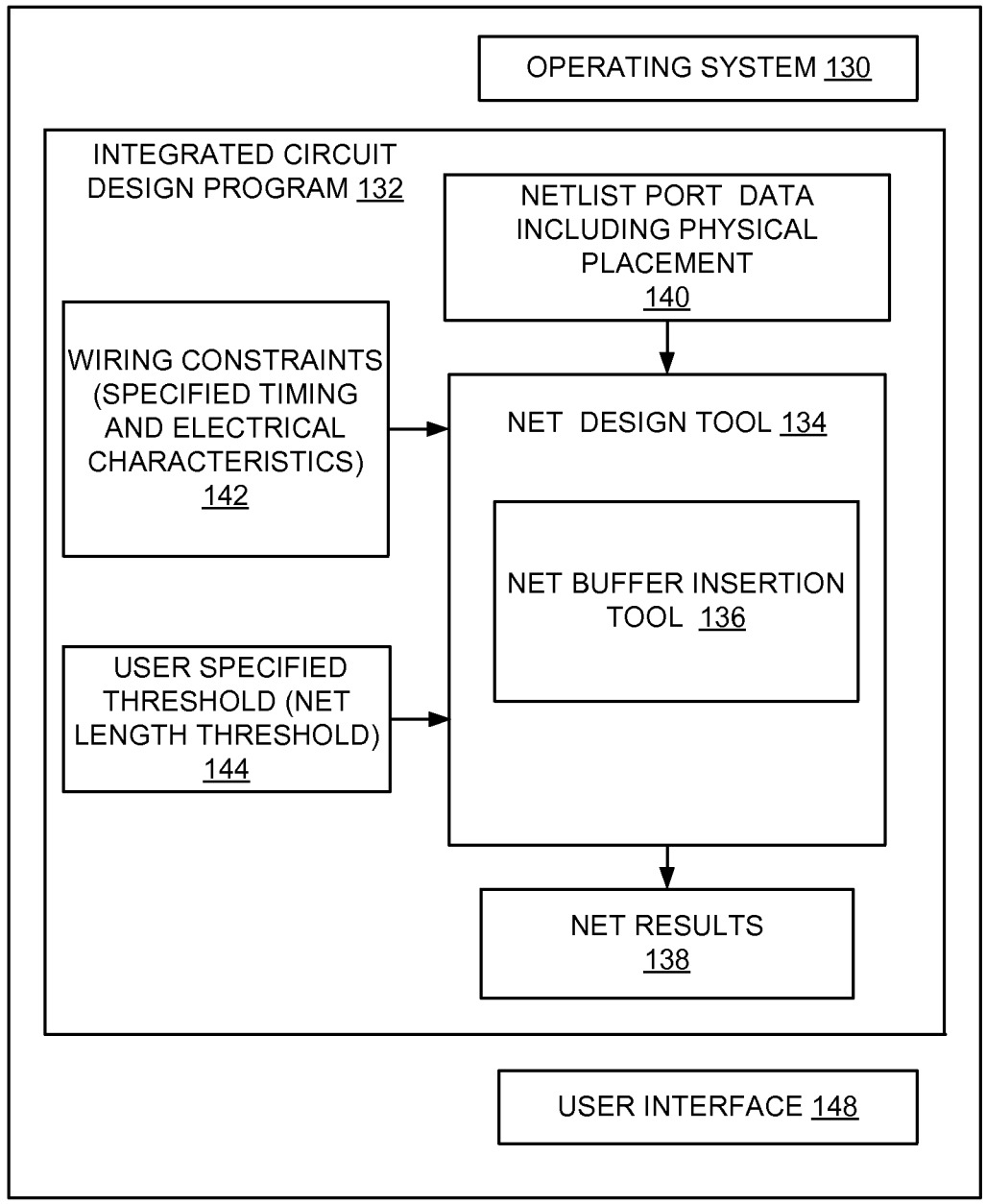
Figure 3:
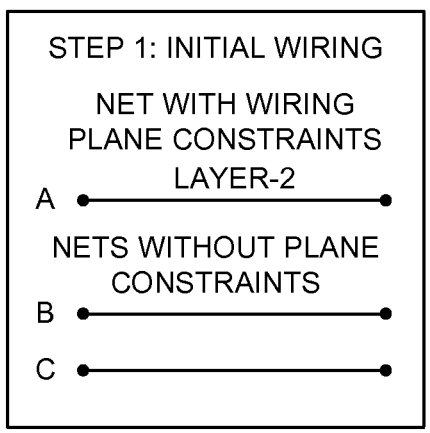
FIG. 3 illustrates a prior art design methodology for an application specific integrated circuit (ASIC)
Figure 3:
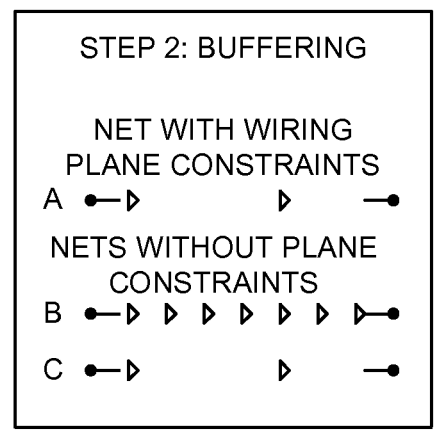
Figure 3:
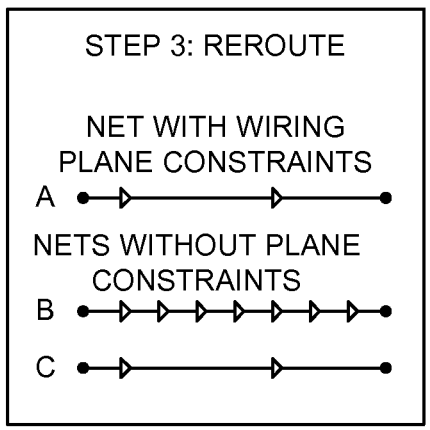

Referring now to the drawings, in FIGS. 1 and 2 there is shown a computer system generally designated by the reference character 100 for implementing enhanced net routing with improved correlation of pre-buffered and post-buffered routes on a hierarchical design of an integrated circuit chip in accordance with the preferred embodiment. Computer system 100 includes a main processor 102 or central processor unit (CPU) 102 coupled by a system bus 106 to a memory management unit (MMU) 108 and system memory including a dynamic random access memory (DRAM) 110, a nonvolatile random access memory (NVRAM) 112, and a flash memory 114. A mass storage interface 116 coupled to the system bus 106 and MMU 108 connects a direct access storage device (DASD) 118 and a CD-ROM drive 120 to the main processor 102. Computer system 100 includes a display interface 122 coupled to the system bus 106 and connected to a display 124.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors.

As shown in FIG. 2, computer system 100 includes an operating system 130, an integrated circuit design program 132, a net design tool 134 and a net buffer insertion tool 136 of the preferred embodiment, providing net results 138, netlist data including physical placement 140 describing physical placement of the random logic macros (RLMs) to be connected, wiring constraints 142 with specified timing and electrical characteristics, a user specified threshold 144, such as a net length threshold, and a user interface 148.

Various commercially available computers can be used for computer system 100. CPU 102 is suitably programmed by the net design tool 134 and net buffer insertion tool 136 to execute the flowchart of FIG. 5 for implementing enhanced routing with improved correlation of pre-buffered and post-buffered routes in accordance with the preferred embodiment.

Figure 4:
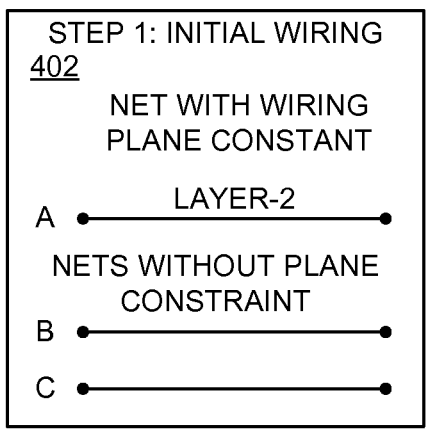
FIG. 4 illustrates exemplary sequential steps for implementing enhanced net routing with improved correlation of pre-buffered and post-buffered routes on a hierarchical design of an integrated circuit chip in accordance with the preferred embodiment.
Figure 4:
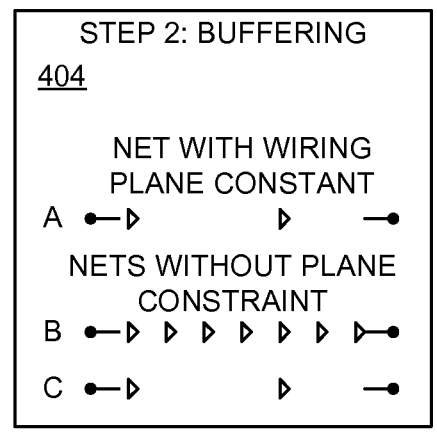
Figure 4:
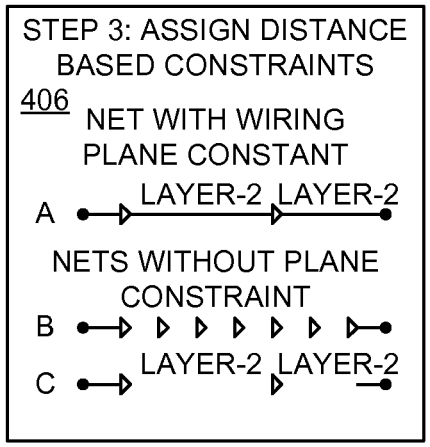
Figure 4:
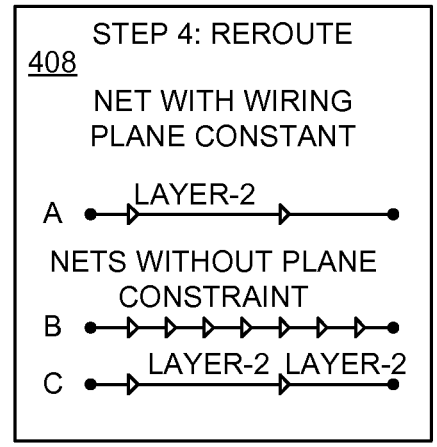

Referring to FIG. 4, there are shown exemplary sequential steps generally designated by the reference character 400 for implementing enhanced net routing with improved correlation of pre-buffered and post-buffered routes in accordance with the preferred embodiment.

As indicated at a block 402 in Step 1, first routing the nets or wires A, B, C are provided between random logic macros (RLMs) on the integrated circuit chip. In the illustrated initial wiring Step 1 at block 402, a first net A includes a wiring plane constraint of an upper layer 2, and a pair of nets B and C without wiring plane constraints. As indicated at a block 404 in a buffering Step 2, buffers indicated by triangles are added along the route of each of the nets A, B, and C.

As indicated at a block 406, in Step 3 in accordance with the preferred embodiment distance based constraints are assigned. The added wiring constraints to the design at block 406 are provided after the design has been buffered based on the spacing of the buffers added at block 404. These wiring constraints are specified at block 406 such that acceptable timing and electrical characteristics are achieved given the spacing that was provided between the buffers added at block 404.

At block 406 all nets, which do not have existing plane constraints are examined. If the net is longer than a user-specified threshold, a constraint is added to the net. This user-specified threshold is the maximum distance for a thin net, which allows it to meet timing and electrical criteria. At block 406 the distance between buffers in the pair of nets B and C without wiring plane constraints are compared to the user-specified threshold. As shown at block 406 a wiring plane constraint of an upper layer 2 is added to the net C.

After all the distance based constraints have been added, the design is rerouted in a reroute Step 4, as indicated at a block 408. With the new constraints added at block 406, none of the buffered paths should fail.

In accordance with features of the invention, the enhanced routing has the benefit of allowing for less constraint on the initial routing solution, which can give the router more freedom to find an efficient solution. The present invention also has the benefit of being less iterative and faster than conventional solutions involving inserting more buffers based on failing timing or electrical criteria.

Figure 5:
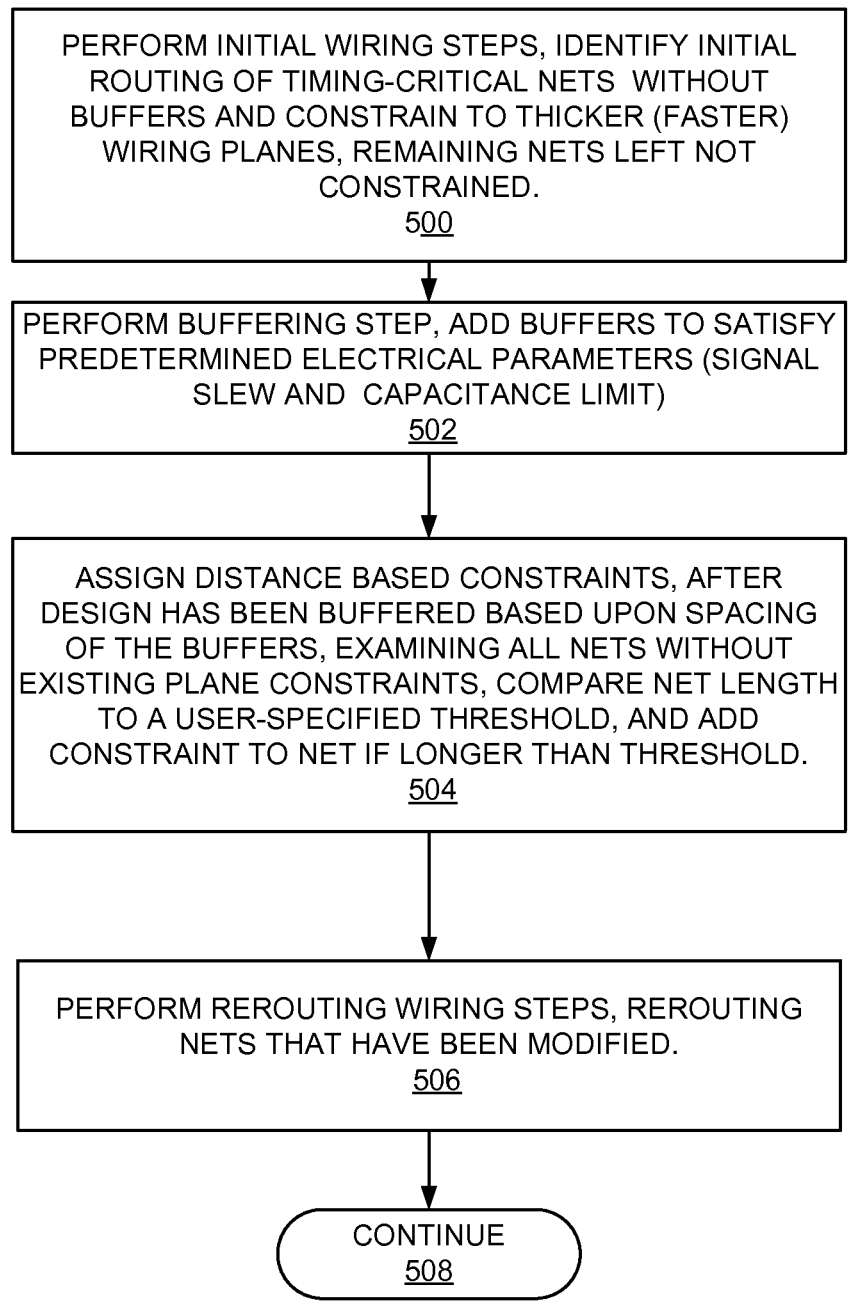
FIG. 5 is a flow chart illustrating exemplary sequential steps for implementing enhanced net routing with improved correlation of pre-buffered and post-buffered routes on a hierarchical design of an integrated circuit chip in accordance with the preferred embodiment.

FIG. 5 is a flow chart illustrating exemplary sequential steps for implementing enhanced net routing with improved correlation of pre-buffered and post-buffered routes on a hierarchical design of an integrated circuit chip in accordance with the preferred embodiment. As indicated at a block 500, initial wiring steps are performed, initial routing of timing-critical nets without buffers are identified and constrained to thicker or faster wiring planes, remaining nets are left not constrained.

Next a buffering step is performed, buffers are added to satisfy predetermined electrical parameter, such as signal slew and capacitance limit as indicated at a block 502.

Next a novel step as indicated at a block 504 is performed after the buffer insertion and before rerouting the nets. At block 504, distance based constraints are assigned based upon spacing of the buffers in the nets without existing plane constraints by comparing the net lengths between buffers to a user-specified threshold, and if longer than the threshold, the constraint to the particular net is added.

Then rerouting wiring steps are performed, rerouting net that have been modified as indicated at a block 506. With the new constraints added at block 504 in accordance with the preferred embodiment, the buffered paths should not fail.

Figure 6:
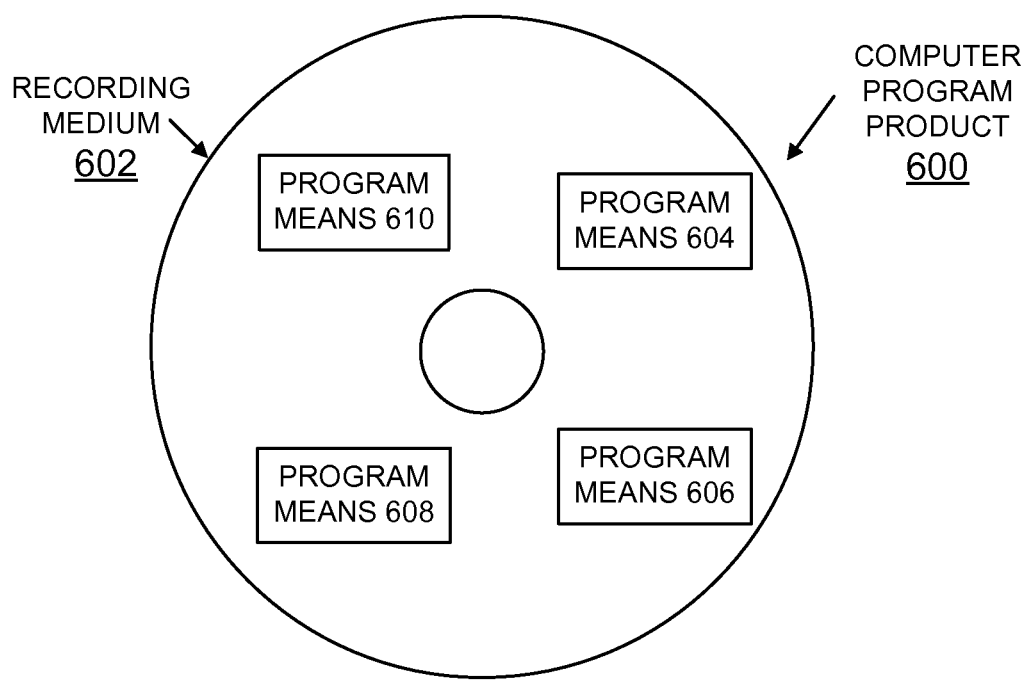
FIG. 6 is a block diagram illustrating a computer program product in accordance with the preferred embodiment.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, or another similar computer program product. Recording medium 602 stores program means 604, 606, 608, 610 on the medium 602 for carrying out the methods for implementing enhanced routing first with improved correlation of pre-buffered and post-buffered routes of the preferred embodiment in the system 100 of FIG. 1.

A sequence of program instructions or a logical assembly of one or more interrelated modules defined by the recorded program means 604, 606, 608, 610, direct the computer system 100 for implementing enhanced routing first with improved correlation of pre-buffered and post-buffered routes on a hierarchical design of an integrated circuit chip of the preferred embodiment.

While the present invention has been described with reference to the details of the embodiments of the invention shown in the drawing, these details are not intended to limit the scope of the invention as claimed in the appended claims.

What is claimed is:

1. A computer-implemented method for implementing enhanced net routing on a hierarchical design of an integrated circuit chip in a computer system including a central processor unit comprising:

using said central processor unit for:
routing nets during initial wiring steps, said routed nets during initial wiring steps including nets without a wiring plane constraint;
adding buffers along the net routes based upon predetermined electrical parameters including predetermined signal slew and capacitance limits;
adding distance based constraints to the nets, responsive to adding the buffers along the net routes based upon spacing of said added buffers; said added distance based constraint including said wiring plane constraint; and
rerouting the nets during final wiring steps.

2. The computer-implemented method as recited in claim 1 wherein adding distance based constraints to the nets, responsive to adding the buffers includes identifying nets without wiring plane constraints.

3. The computer-implemented method as recited in claim 2 includes for each identified net, comparing a net distance between buffers with a predefined threshold, and adding the distance based constraint responsive to the net distance being longer than said predefined threshold.

4. The computer-implemented method as recited in claim 3 wherein said predefined threshold is a user specified net length threshold.

5. The computer-implemented method as recited in claim 1 wherein routing nets during initial wiring steps includes identifying initial routing of timing-critical nets and adding said wiring plane constraint to a predefined wiring plane, and remaining nets being routed without wiring constraints.

6. The computer-implemented method as recited in claim 1 wherein adding distance based constraints to the nets, responsive to adding the buffers along the net routes includes comparing a net length between buffers with a predefined user-selected threshold, and adding said wiring plane constraint to a predefined wiring plane responsive to the net length being longer than said predefined user-selected threshold.

7. An integrated circuit design computer program product for implementing enhanced net routing on a hierarchical design of an integrated circuit chip in a computer system, said computer program product tangibly embodied in a non-transitory machine readable medium used in the integrated circuit design process, said integrated circuit design computer program product including a net design tool and a net buffer insertion tool, said integrated circuit design computer program product including instructions executed by the computer system to cause the computer system to perform the steps of:
routing nets during initial wiring steps, said routed nets during the initial wiring steps including nets without a wiring plane constraint;
adding buffers along the net routes based upon predetermined electrical parameters including predetermined signal slew and capacitance limits;
adding distance based constraints to the nets, responsive to adding the buffers along the net routes based upon spacing of said added buffers; said added distance based constraint including said wiring plane constraint; and
rerouting the nets during final wiring steps.

8. The integrated circuit design computer program product as recited in claim 7 wherein adding distance based constraints to the nets, responsive to adding the buffers includes identifying nets without wiring constraints.

9. The integrated circuit design computer program product as recited in claim 8 includes for each identified net, comparing a net distance between buffers with a predefined threshold, and adding the distance based constraint responsive to the net distance being longer than said predefined threshold.

10. The integrated circuit design computer program product as recited in claim 9 wherein said predefined threshold is a user specified net length threshold.

11. The integrated circuit design computer program product as recited in claim 7 wherein routing nets during initial wiring steps includes identifying initial routing of timing-critical nets and adding said wiring plane constraint to a predefined wiring plane, remaining nets being routed without wiring constraints.

12. The integrated circuit design computer program product as recited in claim 7 wherein adding distance based constraints to the nets, responsive to adding the buffers along the net routes includes comparing a net length between buffers with a predefined user-selected threshold, and adding said wiring plane constraint to a predefined wiring plane responsive to the net length being longer than said predefined user-selected threshold.

13. A system for implementing enhanced net routing on a hierarchical design of an integrated circuit chip comprising:
a processor,
an integrated circuit design program tangibly embodied in a machine readable medium used in the integrated circuit design process, said integrated circuit design program including a net design tool and a net buffer insertion tool, and
said processor using said net design tool, routing nets during initial wiring steps, said routed nets during the initial wiring steps including nets without a wiring plane constraint;
said processor using said net buffer insertion tool, adding buffers along the net routes based upon predetermined electrical parameters including predetermined signal slew and capacitance limits; adding distance based constraints to the nets based upon spacing of said added buffers; said added distance based constraint including said wiring plane constraint, responsive to adding the buffers along the net routes; and rerouting the nets during final wiring steps.

14. The system as recited in claim 13 wherein said processor adding distance based constraints to the nets, responsive to adding the buffers includes said processor identifying nets without wiring constraints.

15. The system as recited in claim 14 includes for each identified net, said processor comparing a net distance between buffers with a predefined threshold, and adding the distance based constraint responsive to the net distance being longer than said predefined threshold.

16. The system as recited in claim 15 wherein said predefined threshold is a user specified net length threshold.

17. The system as recited in claim 13 wherein said processor routing nets during initial wiring steps includes said processor identifying initial routing of timing-critical nets and adding said wiring plane constraint to a predefined wiring plane, and remaining nets being routed without wiring constraints.

* * * * *